(12) United States Patent
Kim et al.

(10) Patent No.: US 10,644,155 B2
(45) Date of Patent: May 5, 2020

(54) METHOD FOR MANUFACTURING A SEMICONDUCTOR DEVICE WITH HORIZONTALLY ALIGNED SEMICONDUCTOR CHANNELS

(71) Applicant: KOREA INSTITUTE OF SCIENCE AND TECHNOLOGY, Seoul (KR)

(72) Inventors: Hyung-jun Kim, Seoul (KR); Sanghyeon Kim, Seoul (KR); Jae-Phil Shim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 15/955,690

(22) Filed: Apr. 18, 2018

(65) Prior Publication Data
US 2018/0350988 A1 Dec. 6, 2018

(30) Foreign Application Priority Data

May 30, 2017 (KR) .......................... 10-2017-0066818

(51) Int. Cl.
*H01L 29/78* (2006.01)
*H01L 29/66* (2006.01)
(Continued)

(52) U.S. Cl.
CPC .......... *H01L 29/7849* (2013.01); *B82Y 10/00* (2013.01); *H01L 21/8258* (2013.01);
(Continued)

(58) Field of Classification Search
None
See application file for complete search history.

(56) References Cited

U.S. PATENT DOCUMENTS 9,425,104 B2 8/2016 Yang et al.
9,425,198 B2 8/2016 Lee et al.
(Continued)

FOREIGN PATENT DOCUMENTS

JP 201342120 A 2/2013
JP 5942204 B2 6/2016
(Continued)

OTHER PUBLICATIONS

M. Yokoyama et al., "CMOS integration of InGaAs nMOSFETs and Ge pMOSFETs with self-align Ni-based metal S/D using direct wafer bonding," Symposium on VLSI Technology Digest of Technical Papers, 2011, pp. 60-61.
(Continued)

*Primary Examiner* — Telly D Green
(74) *Attorney, Agent, or Firm* — Cantor Colburn LLP

(57) ABSTRACT

Disclosed is a semiconductor device, which includes: forming a first channel layer including a Group III-V compound or germanium (Ge) and having a first semiconductor characteristics on a first substrate; forming a second channel layer including a Group III-V compound or germanium (Ge) and having a second semiconductor characteristics different from the first semiconductor characteristics on the first channel layer; forming a bonding layer containing an oxide on a second channel layer; allowing the bonding layer to be bound to the second substrate so that a structure including the bonding layer, the second channel layer, the first channel layer and the first substrate may be stacked on the second substrate; removing the first substrate stacked on the second substrate; and removing the first channel layer from a partial region of the structure stacked on the second substrate.

9 Claims, 23 Drawing Sheets

(51) Int. Cl.
  *H01L 29/16* (2006.01)
  *H01L 29/20* (2006.01)
  *B82Y 10/00* (2011.01)
  *H01L 21/8258* (2006.01)
  *H01L 29/06* (2006.01)
  *H01L 29/775* (2006.01)
  *H01L 21/8238* (2006.01)

(52) U.S. Cl.
  CPC .......... *H01L 29/0673* (2013.01); *H01L 29/16* (2013.01); *H01L 29/20* (2013.01); *H01L 29/66439* (2013.01); *H01L 29/66462* (2013.01); *H01L 29/66469* (2013.01); *H01L 29/775* (2013.01); *H01L 21/823807* (2013.01)

(56) References Cited

U.S. PATENT DOCUMENTS

| | | | |
|---|---|---|---|
| 9,570,359 | B2 | 2/2017 | Yang et al. |
| 9,978,650 | B2* | 5/2018 | Cheng ............... H01L 29/66795 |
| 10,014,216 | B2* | 7/2018 | Kim ................... H01L 21/6835 |
| 2013/0015499 | A1 | 1/2013 | Briere |
| 2014/0091310 | A1 | 4/2014 | Jeon et al. |
| 2014/0091393 | A1 | 4/2014 | Hata et al. |
| 2014/0110759 | A1 | 4/2014 | Murata et al. |
| 2015/0108430 | A1* | 4/2015 | Cheng ............... H01L 29/66795 257/20 |
| 2016/0343810 | A1* | 11/2016 | Kim ................... H01L 21/6835 |
| 2018/0269111 | A1* | 9/2018 | Cheng ............... H01L 29/66795 |

FOREIGN PATENT DOCUMENTS

| | | |
|---|---|---|
| KR | 101020841 B1 | 3/2011 |
| KR | 1020140033070 A | 3/2014 |
| KR | 1020140042474 A | 4/2014 |
| KR | 1020140143869 A | 12/2014 |
| KR | 1020150028626 A | 3/2015 |
| KR | 1020150050095 A | 5/2015 |
| KR | 1020150050096 A | 5/2015 |
| KR | 1020160136103 A | 11/2016 |
| KR | 1020170017886 A | 2/2017 |
| WO | 2015199655 A1 | 12/2015 |

OTHER PUBLICATIONS

S. Takagi et al., "III-V/Ge CMOS Device Technologies for High Performance Logic Applications," ECS Transactions, 2013, pp. 85-96, vol. 53, Issue 3, The Electrochemical Society.

* cited by examiner

METHOD FOR MANUFACTURING A SEMICONDUCTOR DEVICE WITH HORIZONTALLY ALIGNED SEMICONDUCTOR CHANNELS

CROSS-REFERENCE TO RELATED APPLICATION

This application claims priority to Korean Patent Application No. 10-2017-0066818, filed on May 30, 2017, and all the benefits accruing therefrom under 35 U.S.C. § 119, the contents of which in its entirety are herein incorporated by reference.

BACKGROUND

1. Field

The present disclosure relates to a semiconductor device having horizontally aligned semiconductor channels and a method for manufacturing the same. More particularly, the present disclosure relates to technology of manufacturing a semiconductor device, which includes epitaxially stacking Group III-V compound semiconductor and germanium (Ge) channels having different semiconductor characteristics vertically on a single substrate, transferring the resultant product to another substrate, and carrying out etching to separate the channels having different semiconductor characteristics horizontally.

Description about National Research and Development Support

This study was supported by the Electronic Information Device Industry Source Technology Development Project—Leading Research Support Project of Ministry of Commerce, Industry and Energy, Republic of Korea (Development Project of III-V compound semiconductor MOSFET and transfer process technology for monolithic three-dimensional integration on silicon substrate, Project No. 1711041155) under the Korea Institute of Science and Technology.

2. Description of the Related Art

A semiconductor device, such as a transistor, has been obtained conventionally from a silicon (Si)-based material. However, recently, studies have been conducted about different kinds of channel materials having high electron and hole mobility in order to overcome a physical limitation caused by downsizing of the silicon-based devices. Among such materials, Group III-V compound semiconductors and germanium have significantly higher electron and hole mobility as compared to silicon, and thus have been given many attentions as materials for realizing an ultrahigh-speed metal oxide semiconductor field effect transistor (MOSFET).

When forming MOSFET by using a Group III-V compound semiconductor and germanium (Ge) as channel materials, there are advantages in that it is possible to expect a decrease in consumption of voltage by virtue of a smaller drain voltage as compared to the silicon-based MOSFETs, to utilize the existing large-scale silicon material-based system and to reduce the processing cost by transferring them onto a silicon substrate, and to enjoy the well-aged technology in the related applications by virtue of excellent electrooptic characteristics derived from direct band gap property of the Group III-V compound semiconductors.

However, when forming MOSFET finally and allowing it to perform logic operation, it is required that an n-type metal oxide semiconductor (MOS) and p-type metal oxide semiconductor are present on a single substrate. In the case of silicon, n-MOS and p-MOS are formed through ion implantation, respectively. However, in the case of a group III-V compound semiconductor and germanium (Ge), single crystals are damaged fatally during the ion implantation, and thus ion implantation cannot be used. Therefore, a process for forming n-MOS separately from p-MOS by epitaxial growths and subsequently transferring them onto a silicon substrate is required.

FIGS. 1A to 1D show cross-sectional views each illustrating a conventional method for manufacturing a semiconductor device using a Group III-V compound.

Referring to FIG. 1A, in the conventional method, a sacrificial layer 101 and channel layer 102 including a Group III-V compound are grown sequentially in an epitaxial mode on a substrate 100 also including a Group II-V compound. Then, as shown in FIG. 1B, the channel layer 102 is bound to a silicon substrate 110 through wafer bonding.

Then, as shown in FIG. 1C, the sacrificial layer 101 is etched to remove the sacrificial layer 101 in an epitaxial lift-off (ELO) mode, so that the substrate may be removed separately. Finally, as shown in FIG. 1D, a structure including the Group III-V compound semiconductor channel layer 102 stacked on the silicon substrate 110 is obtained.

However, according to the conventional method as described above, it is required to carry out the process of transferring the Group III-V compound semiconductor and germanium (Ge) channel layers horizontally in parallel with each other onto the silicon substrate at least twice in order to form n-MOS and p-MOS. Thus, the process shows low efficiency. There is a problem in that the positions of n-MOS and p-MOS transferred through different processes should be aligned precisely. In addition, when n-MOS and p-MOS are different materials, i.e., a Group III-V compound (e.g. indium gallium arsenic (InGaAs)) having relatively higher electron mobility and a Group III-V compound (e.g. indium gallium antimony (InGaSb) or germanium (Ge)) having relatively higher hole mobility, respectively, the conventional method for manufacturing a semiconductor device has a limitation in scaling.

SUMMARY

The present disclosure is directed to providing a method for manufacturing a semiconductor device, which includes epitaxially stacking Group III-V compound semiconductor and germanium (Ge) channels having different semiconductor characteristics vertically on a single substrate, transferring the channels to another substrate, and carrying out etching to obtain a semiconductor device in which the channels having different semiconductor characteristics are separated horizontally, and a semiconductor device obtained thereby.

In one aspect, there is provided a method for manufacturing a semiconductor device, which includes: forming a first channel layer including a Group III-V compound or germanium (Ge) and having a first semiconductor characteristics on a first substrate; forming a second channel layer including a Group III-V compound or germanium (Ge) and having a second semiconductor characteristics different from the first semiconductor characteristics on the first channel layer; forming a bonding layer containing an oxide on a second channel layer; stacking a structure comprising the bonding layer, the second channel layer, the first channel layer and the first substrate on a second substrate by allowing the bonding layer to be bound to the second substrate; removing the first substrate stacked on the second substrate; and removing the first channel layer from a partial region of the structure stacked on the second substrate.

According to an embodiment, the operation of forming the first channel layer includes forming a sacrificial layer on the first substrate. Herein, the first channel layer is positioned on the sacrificial layer and the operation of removing the first substrate includes removing the sacrificial layer by etching.

According to another embodiment, the sacrificial layer includes aluminum arsenic (AlAs) or indium aluminum arsenic (InAlAs).

According to still another embodiment, the method further includes forming a barrier layer on the first channel layer, before forming the second channel layer.

According to still another embodiment, the barrier layer has a lattice constant different from the lattice constant of at least one of the first channel layer and the second channel layer. According to still another embodiment, the barrier layer includes aluminum gallium arsenic (AlGaAs) or indium aluminum arsenic (InAlAs).

According to still another embodiment, the method for manufacturing a semiconductor device further includes forming an additional bonding layer on the second substrate, before stacking onto the second substrate.

According to still another embodiment, the operation of forming the first channel layer and the operation of forming the second channel layer are carried out repeatedly, so that the structure has a structure in which the first channel and the second channel layer are stacked alternately many times.

According to still another embodiment, the method for manufacturing a semiconductor device further includes removing the second channel layer from a region different from the partial region.

According to yet another embodiment, the first channel layer includes gallium arsenic (GaAs) or indium gallium arsenic (InGaAs), and the second channel layer includes germanium (Ge) or gallium arsenic (GaAs).

In another aspect, there is provided a semiconductor device including: a substrate; a bonding layer disposed on the substrate and containing an oxide; a first channel layer bound to the substrate through the bonding layer, including a Group III-V compound including a Group III-V compound or germanium (Ge) and having the first semiconductor characteristics; and a second channel layer disposed at a higher position as compared to the first channel layer from the surface of the substrate, including a Group III-V compound or germanium (Ge) and having the second semiconductor characteristics different from the first semiconductor characteristics.

According to an embodiment, the semiconductor device further includes a barrier layer disposed between the first channel layer and the second channel layer.

According to another embodiment, the barrier layer has a lattice constant different from the lattice constant of at least one of the first channel layer and the second channel layer. According to still another embodiment, the barrier layer includes aluminum gallium arsenic (AlGaAs) or indium aluminum arsenic (InAlAs).

According to still another embodiment, the semiconductor device further includes at least one additional first channel layer disposed on the first channel layer and at least one additional second channel layer disposed on the second channel layer. Herein, such at least one additional first channel layer and at least one additional second channel layer are stacked alternately with each other.

According to still another embodiment, the first channel layer includes gallium arsenic (GaAs) or indium gallium arsenic (InGaAs), and the second channel layer includes germanium (Ge) or gallium arsenic (GaAs).

In still another aspect, there is provided a field effect transistor (FET) including any one of the semiconductor devices as described above.

According to the method for manufacturing a semiconductor device disclosed herein, it is possible to obtain a semiconductor device in which channels having different semiconductor characteristics are separated horizontally by epitaxially stacking Group III-V compound and germanium (Ge) channels having different semiconductor characteristics, such as an n-type metal oxide semiconductor (MOS) and p-type MOS, vertically on a single substrate, and transferring the channels to another substrate, and then carrying out etching.

According to the method for manufacturing a semiconductor device disclosed herein, the Group III-V compound and germanium (Ge) channels having different semiconductor characteristics are stacked on a silicon (Si)-based substrate through a single transfer process, and thus there is no problem related with a need for aligning and stacking n-MOS and p-MOS through different processes, which, otherwise, occurs in the conventional method for manufacturing a semiconductor using a Group III-V compound and germanium (Ge).

In addition, according to the method for manufacturing a semiconductor device disclosed herein, it is possible to apply Group III-V substrates having different lattice constants and various combinations of Group III-V compound channels corresponding thereto during the epitaxial growth process. Further, the barrier layer between the semiconductor channels or any one semiconductor channel layer may be used to apply strain to another semiconductor channel layer. Such strain is retained on the GeOI structure even after wafer bonding and ELO process, and thus it is possible to improve electron and hole mobility depending on the type of strain.

DETAILED DESCRIPTION

Figure 1A:
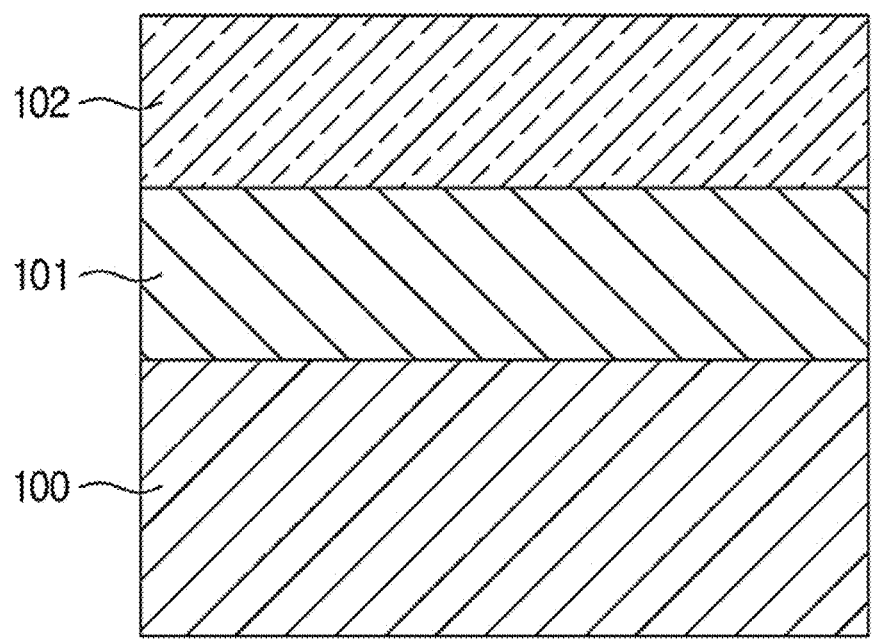
FIGS. 1A to 1D are sectional views illustrating a method for manufacturing a semiconductor device using a Group III-V compound according to the related art.
Figure 1B:
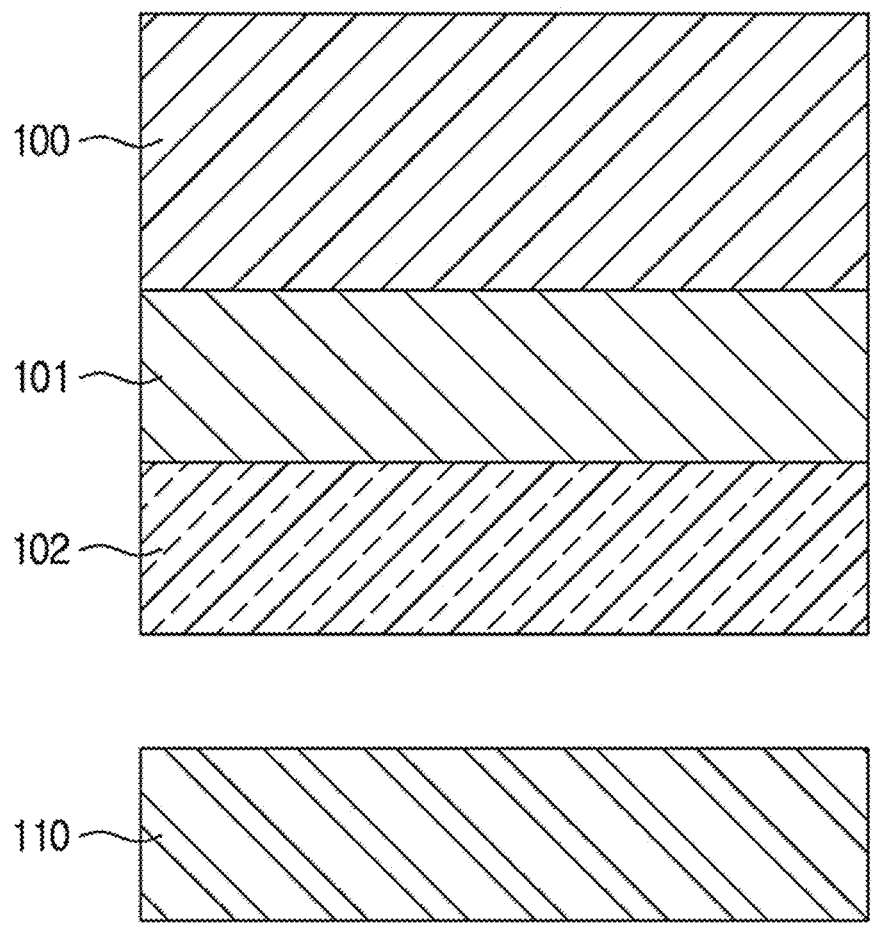
Figure 1C:
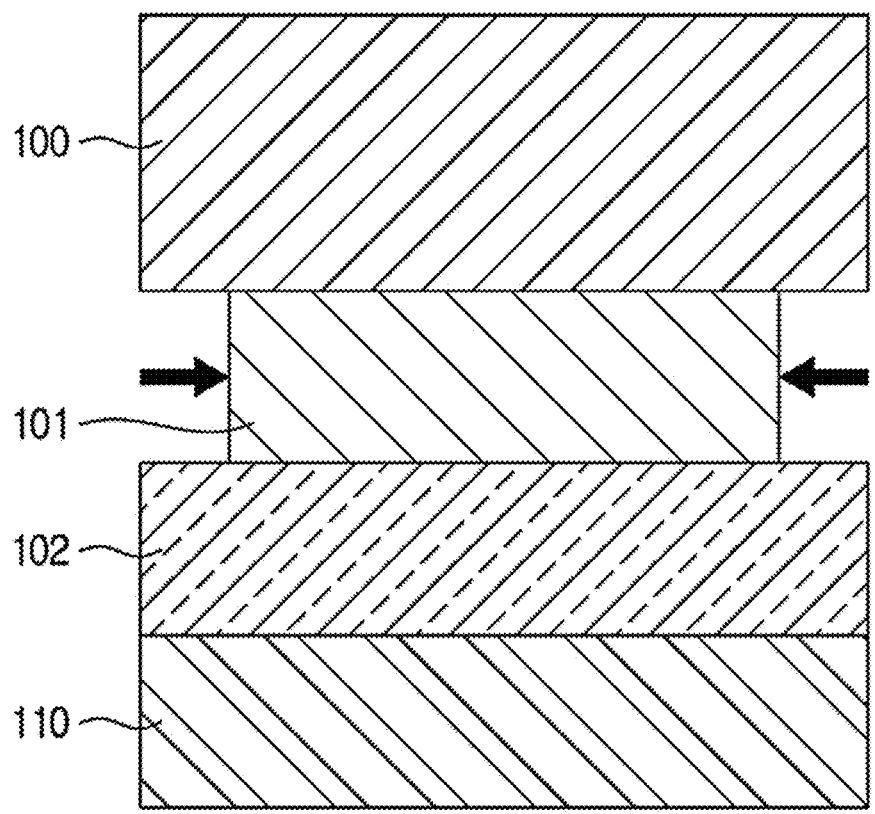
Figure 1D:
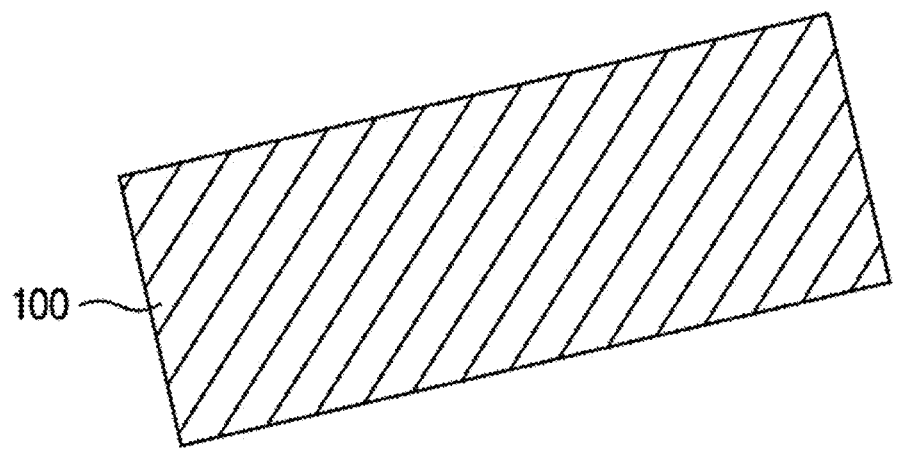
Figure 1D:
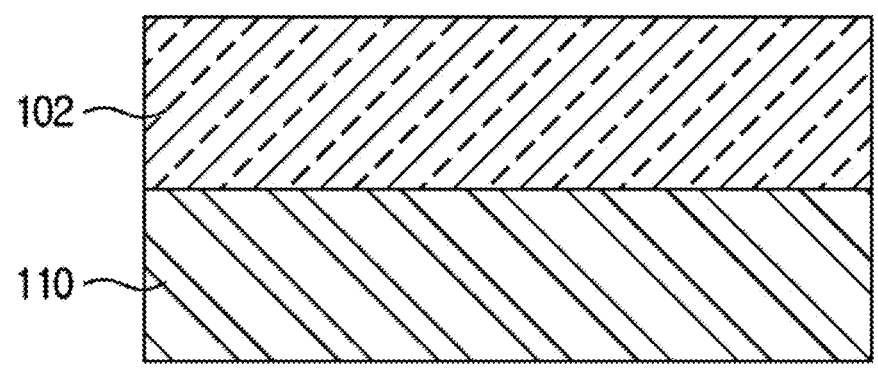

Hereinafter, particular embodiments of the present disclosure will be explained in detail with reference to the accompanying drawings.

As used herein, the expression 'one portion is disposed on another portion' means that one portion is disposed directly on the other portion with or without still another portion disposed between them. On the contrary, the expression 'one portion is disposed [directly on] the other portion' means that no additional portion is disposed between them.

The terms 'first, second, third, and the like' is used to illustrating different portions, ingredients, regions, layers and/or sections, but is not limited thereto. The terms are used only in order to differentiate one portion, ingredient, region, layer or section from another portion, ingredient, region, layer or section. Therefore, the first portion, ingredient, region, layer or section described hereinafter may be referred to as the second portion, ingredient, region, layer or section without departing from the scope of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, and/or components thereof.

The terms, such as 'under' and 'on', expressing a relative spatial position may be used to illustrate the relationship of one portion shown in the drawings with another portion more easily. Such terms are intended to cover other meanings or operations of the used apparatus together with desired meanings. For example, when the apparatus shown in the drawings is inverted, some portions expressed as being disposed under the other portions may be expressed as being disposed on the other positions. Therefore, the term 'under' covers both the term 'on' and the term 'under'. The apparatus may be rotated at 90° or a different angle, and the terms expressing a relative spatial position may be interpreted correspondingly.

Although it is not stated otherwise, all terms including technological terms and scientific terms have the same meanings as understood by those skilled in the art. The terms defined in the currently used dictionaries are also interpreted based on the meanings and concepts corresponding to technical aspects of the present disclosure and related documents, and are not interpreted as ideal or official meanings, unless otherwise defined.

FIGS. 2A to 2D are cross-sectional views illustrating each of the operations of the method for manufacturing a semiconductor device according to an embodiment.

Figure 2A:
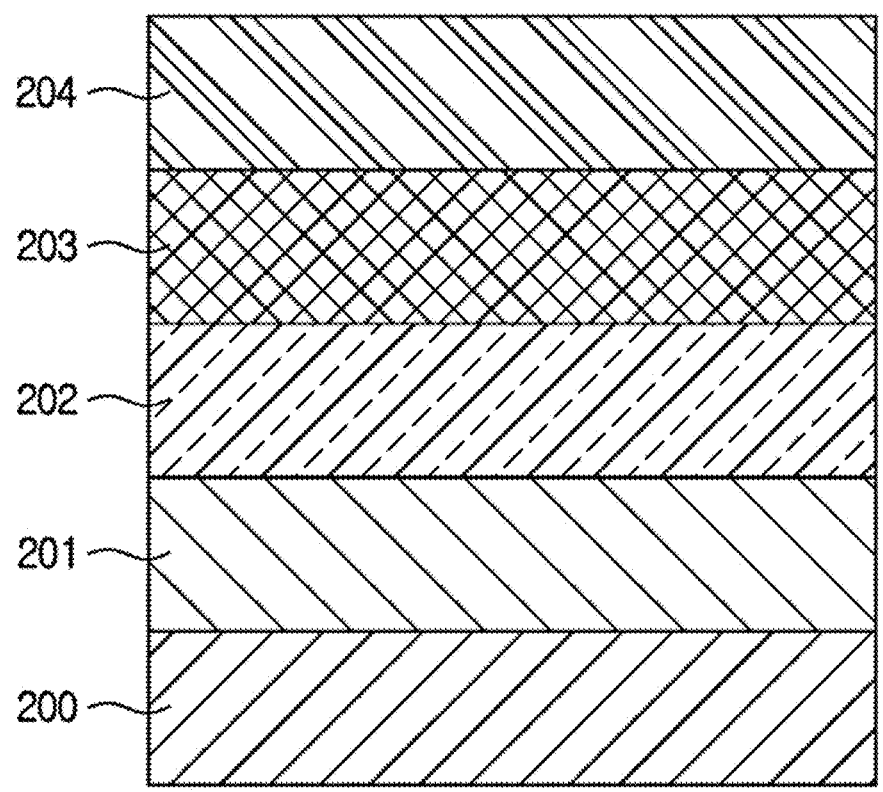
FIGS. 2A to 2D are sectional views illustrating each of the operations of the method for manufacturing a semiconductor device according to an embodiment.

Referring to FIG. 2A, first, a sacrificial layer 201, a first channel layer 202 and a second channel layer 204 may be formed successively on a substrate (also referred to as a first substrate). The substrate 200 includes a Group III-V compound having excellent electron transportability. For example, the substrate 200 may include gallium arsenic (GaAs) or indium phosphide (InP), but is not limited thereto. The sacrificial layer 201, the first channel layer 202 and the second channel layer 204 are formed on the substrate 200 in an epitaxial growth mode.

The first channel layer 202 and the second channel layer 204 have different semiconductor characteristics. For example, the first channel layer 202 may be a portion corresponding to an n-type metal oxide semiconductor (MOS) and may include gallium arsenic (GaAs), and the second channel layer 204 may be a portion corresponding to a p-type MOS and may include germanium (Ge). However, combinations of the first channel layer 202 with the second channel layer 204 are not limited thereto. For example, the first channel layer 202 may include indium gallium arsenic (InGaAs) or a different Group III-V compound. In addition, the second channel layer 204 may include gallium arsenic (GaAs) or a different Group III-V compound.

According to an embodiment, a barrier layer 203 may be formed before the second channel layer 204 is grown and after growing the first channel layer 202. The barrier layer 203 is a portion intended to insulate between the first channel layer 202 and the second channel layer 204. Like the first channel layer 202 and the second channel layer 204, the barrier layer may be formed on the substrate 200 in an epitaxial growth mode. For example, the barrier layer 203 may include aluminum gallium arsenic (AlGaAs) or indium aluminum arsenic (InAlAs), but is not limited thereto.

Figure 2B:
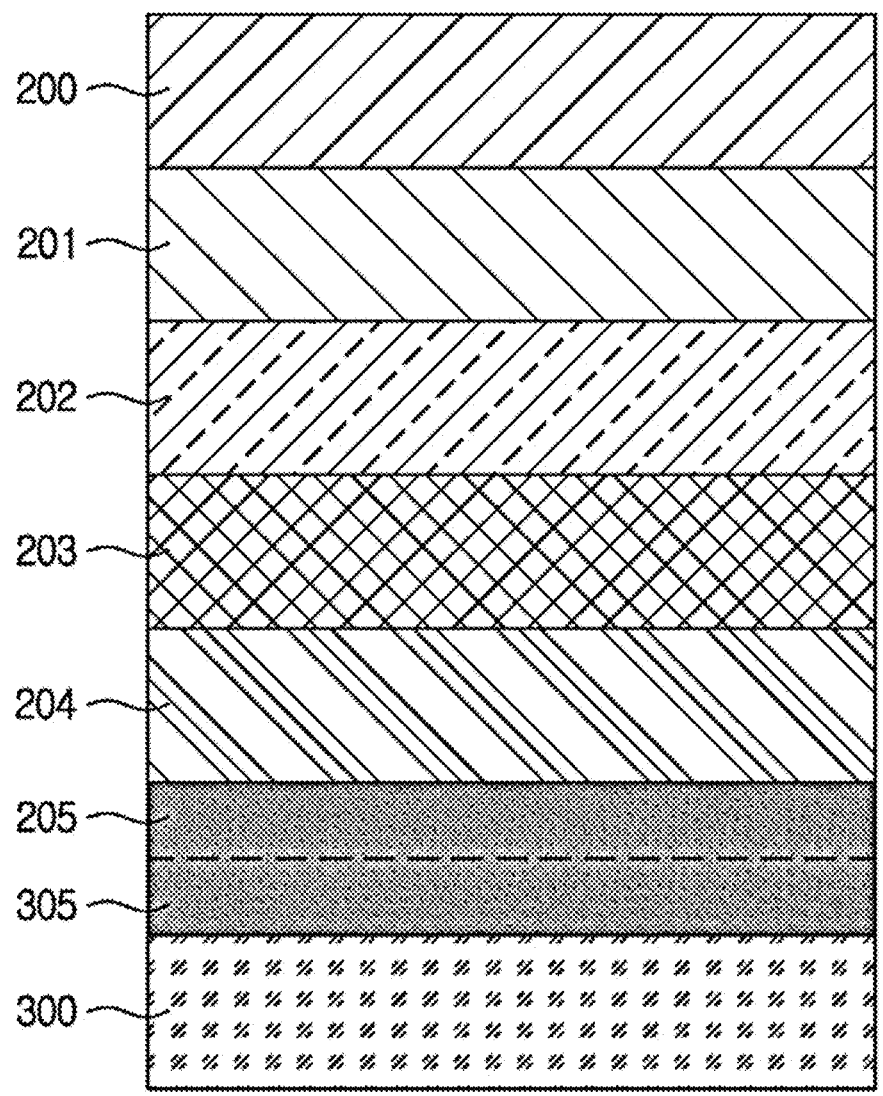

Referring to FIG. 2B, a bonding layer 205 containing an oxide is formed on the structure including the first substrate 200, the first channel layer 202 and the second channel layer 204 as described above, and then the structure may be stacked on a second substrate 300 so that the bonding layer 205 may be bound to the second substrate 300. Particularly, the second substrate 300 includes silicon (Si). Herein, a bonding layer 305 may also be formed on the second substrate 300. The bonding layers 205, 305 is a portion intended to perform wafer bonding of the Group III-V compound structure formed on the first substrate 200 with the second substrate 300. For example, the bonding layers may be buried oxide (BOX) layers including yttrium oxide ($Y_2O_3$), or the like, but are not limited thereto.

Figure 2C:
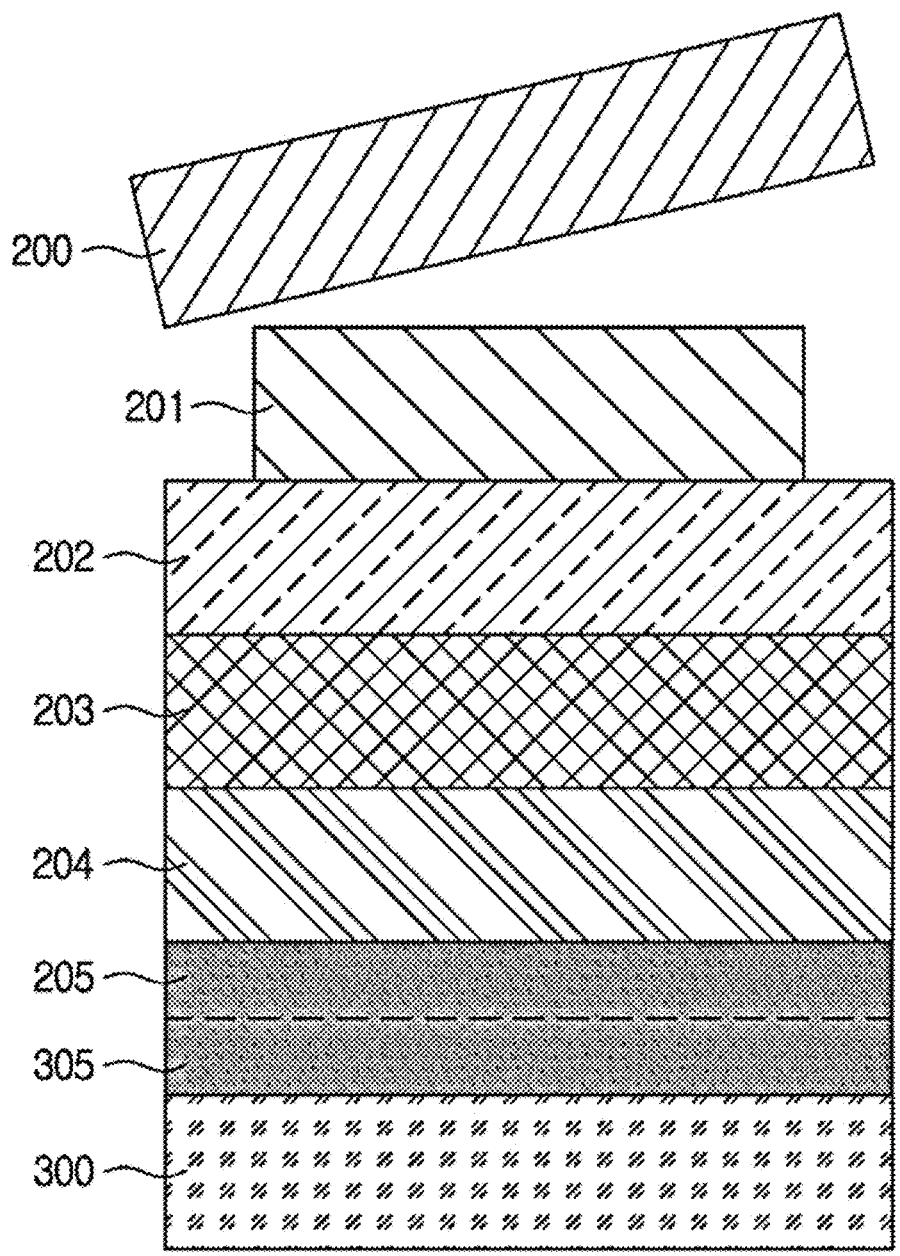

Referring to FIG. 2C, the sacrificial layer 201 is etched to remove the first substrate 200. The etching is carried out while controlling the selectivity of an etching solution in order to etch only the sacrificial layer 201 while not etching the channel layers 202, 204. The etching solution used for etching the sacrificial layer 201 may be a hydrophilic solution containing hydrogen fluoride (HF) and may include isopropyl alcohol (IPA) and/or acetone for inhibiting gas bubbling, but is not limited thereto. The above-mentioned operation of removing the first substrate 200 may be understood with ease from epitaxial lift-off (ELO).

Figure 2D:
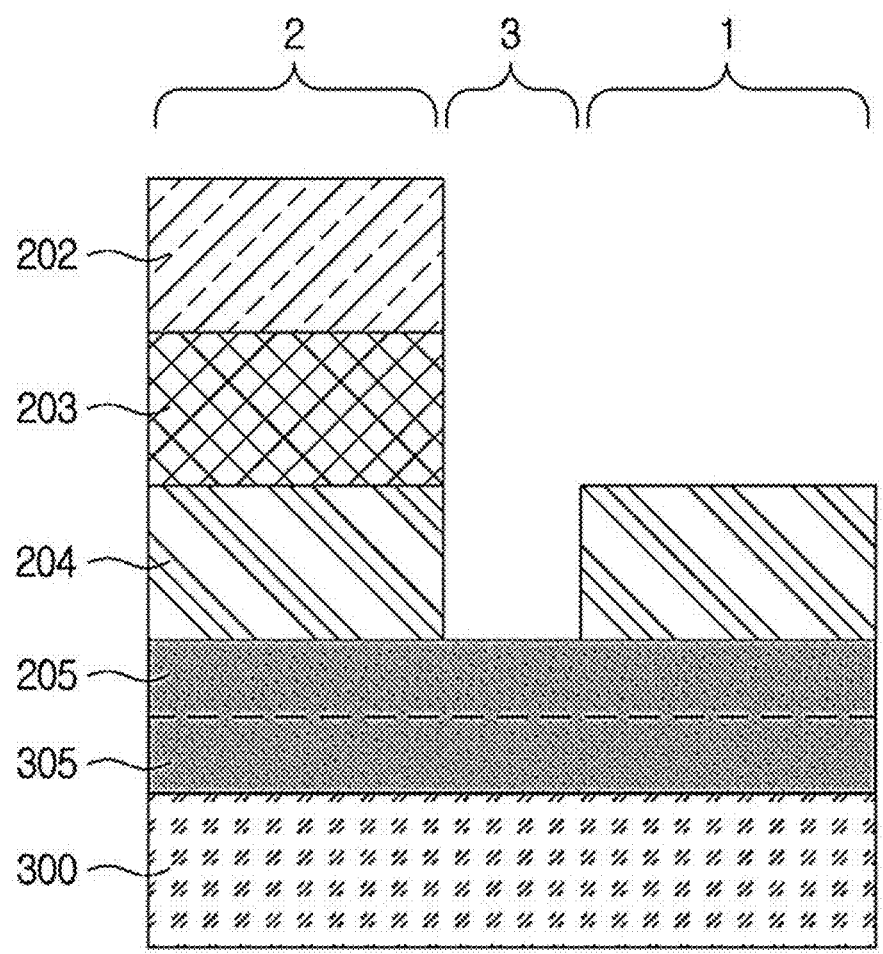

Referring to FIG. 2D, when the sacrificial layer is removed completely, the first substrate is separated to finish the ELO operation. Then, the second channel layer 204 is removed by etching at a partial region 1 of the exposed surface of the vertically stacked structure, thereby forming a semiconductor device. Herein, when the barrier layer 203 is present, it may also be removed. As a result, the first channel layer 202 is exposed in the partial region 1 of the semiconductor device, while the second channel layer 204 having the semiconductor characteristics different from those of the first channel layer 202 is exposed in another partial region 2. Herein, both the first channel layer 202 and the second channel layer 204 may be removed in a region 3 positioned between the two regions 1, 2 so that the two regions 1, 2 may be spaced apart from each other horizontally.

Figure 3A:
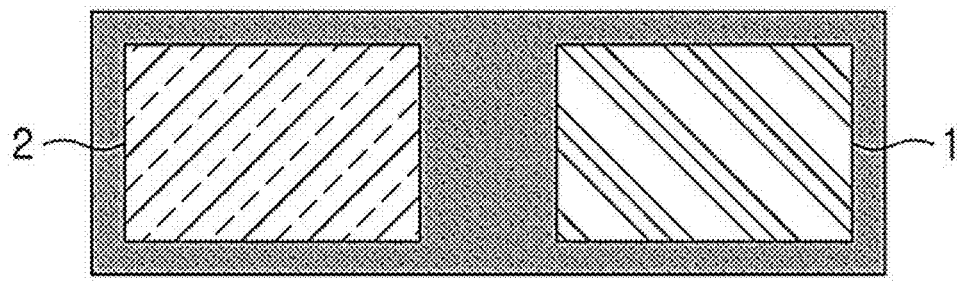
FIG. 3A is a plan view illustrating the semiconductor device as shown in FIG. 2D.
Figure 3B:
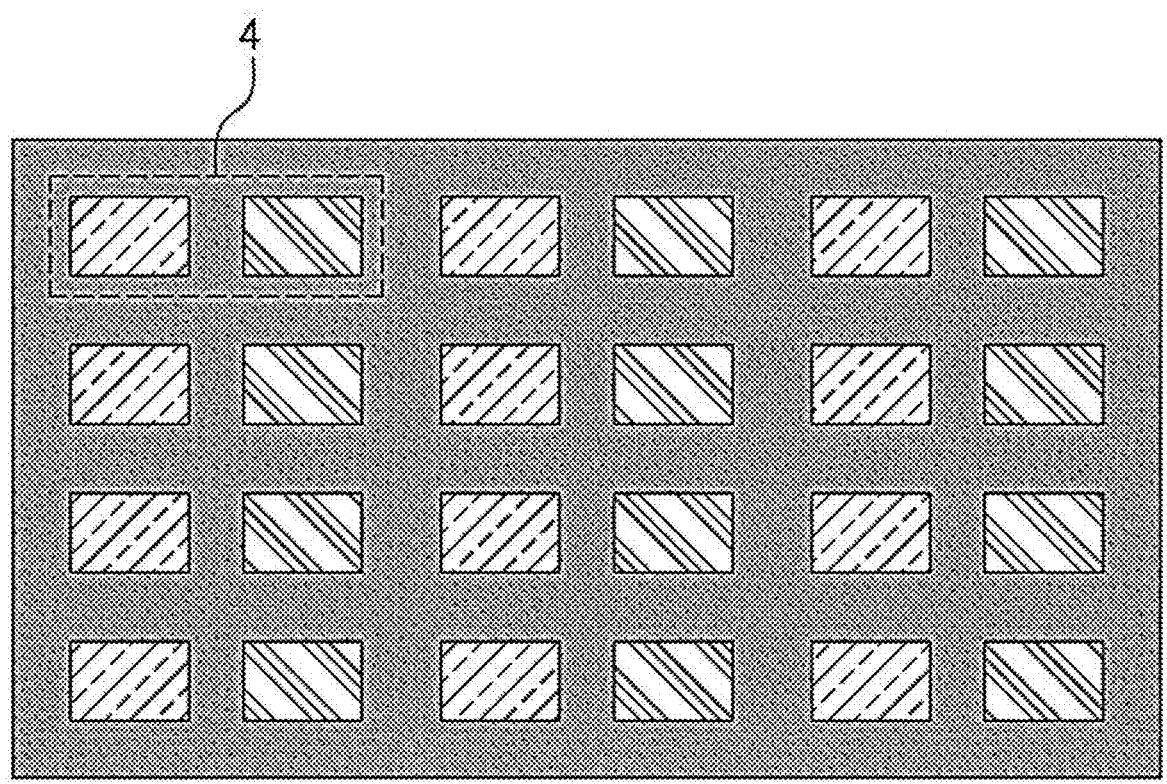
FIG. 3B is a plan view of an apparatus in which the semiconductor device as shown in FIG. 3A is arranged in the form of an array.

FIG. 3A is a plane-view illustrating the semiconductor device as shown in FIG. 2D, and FIG. 3B is a plane-view of an apparatus in which the semiconductor device as shown in FIG. 3A is arranged in the form of an array.

As a result of the process described with reference to FIGS. 2A to 2D, it is possible to obtain a semiconductor device in which Group III-V channels (e.g. n-MOS and p-MOS) having different semiconductor characteristics are spaced apart from each other horizontally in each of the regions 1, 2 as shown in FIG. 3A. In addition, as shown in FIG. 3B, the semiconductor devices 4 may be aligned on a plane in the form of an array to provide an apparatus. According to the above-described method for manufacturing a semiconductor device, the semiconductor channel layers 202, 204 in each of the regions 1, 2 are transferred to the silicon substrate 300 through a single time of wafer bonding, and thus there is no problem related with alignment of semiconductor layers, which, otherwise, occurs according to the related art.

Figure 4A:
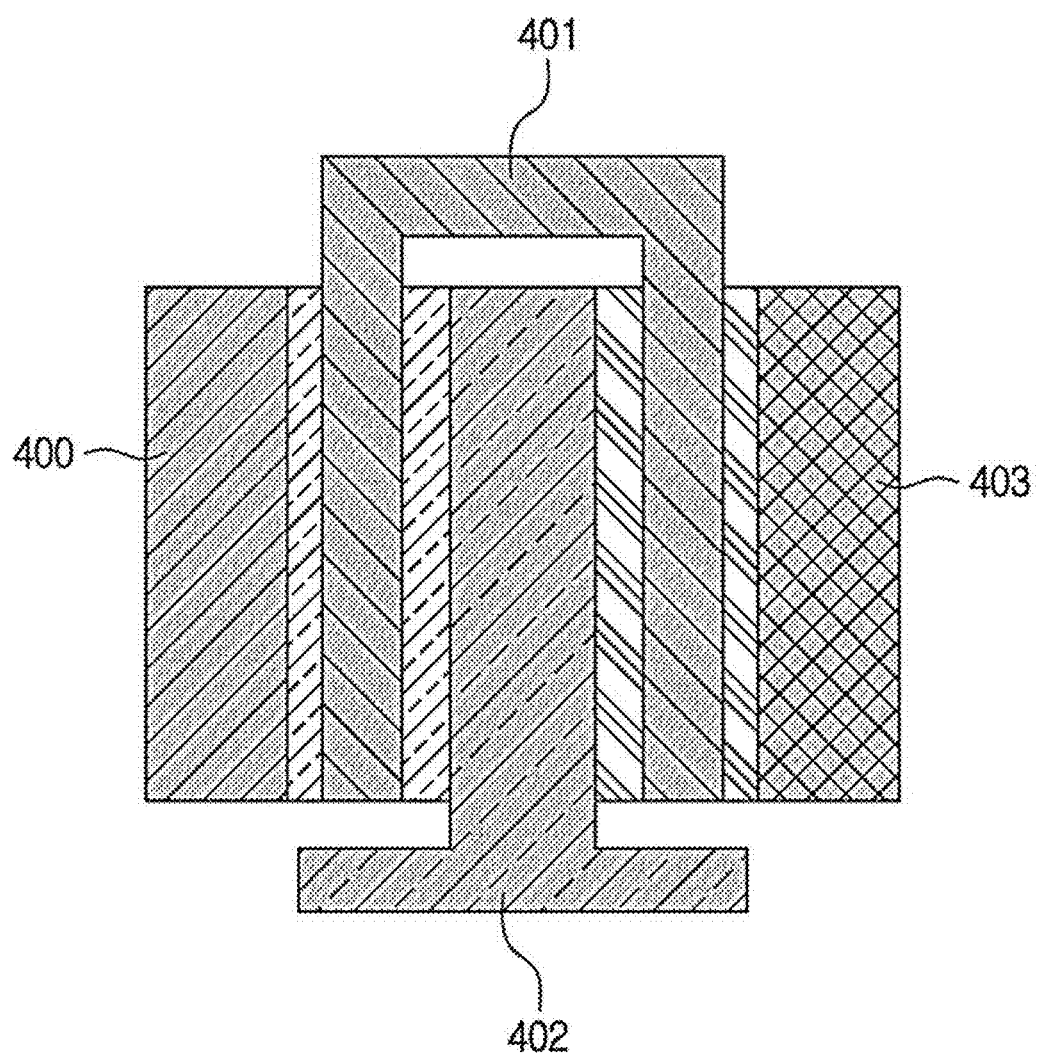
FIG. 4A is a plan view illustrating a complementary metal oxide semiconductor (CMOS) inverter including the semiconductor device according to an embodiment.
Figure 4B:
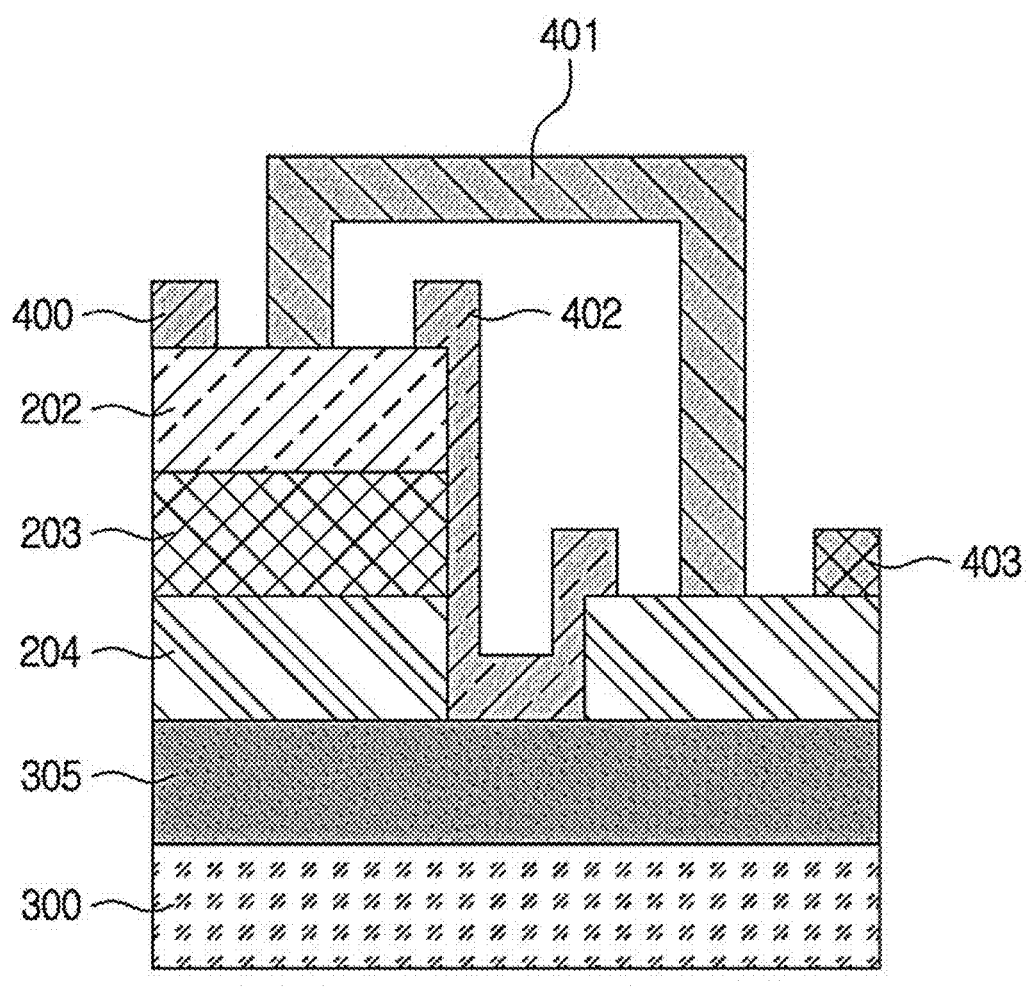
FIG. 4B is a sectional view of the CMOS inverter as shown in FIG. 4A.

FIG. 4A is a plane-view illustrating a complementary metal oxide semiconductor (CMOS) inverter including the semiconductor device according to an embodiment, and FIG. 4B is a cross-sectional view of the CMOS inverter as shown in FIG. 4A.

Referring to FIG. 4A and FIG. 4B, it is possible to finish a device by forming at least one electrode 400-403 for applying voltage to each of the channel layers 202, 204 in the semiconductor device as shown in FIG. 2D. The electrodes may include a ground electrode 400, a first electrode 401 to which input voltage ($V_{in}$) is applied, a second electrode 402 to which output voltage ($V_{in}$) is applied, and a third electrode 403 to which drain voltage ($V_{dd}$) is applied, but is not limited thereto.

Figure 5A:
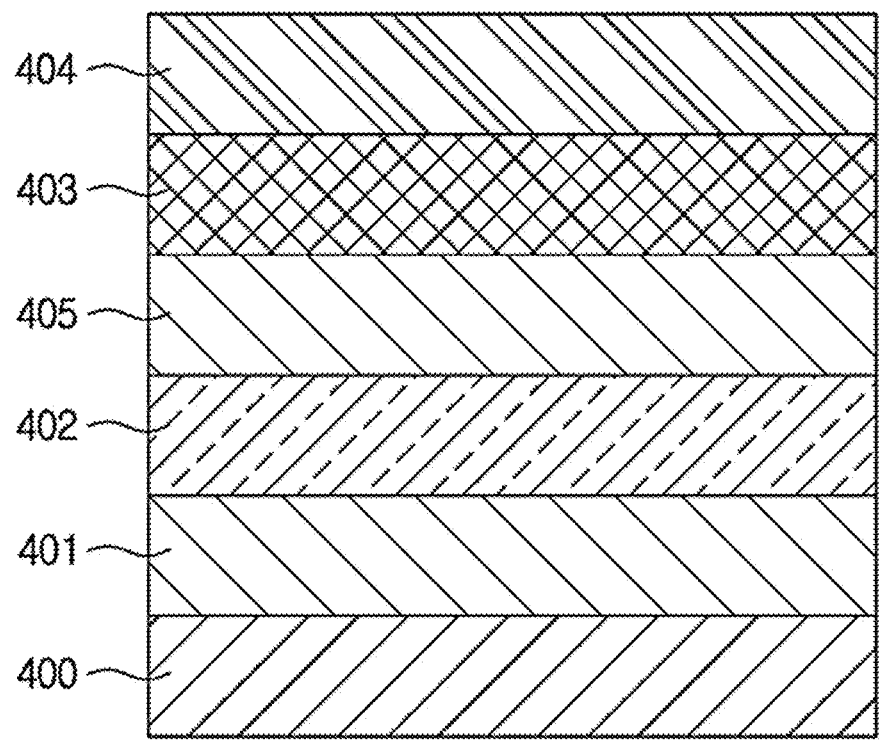
FIGS. 5A to 5C are sectional views illustrating each of the operations of the method for manufacturing a semiconductor device according to another embodiment.
Figure 5B:
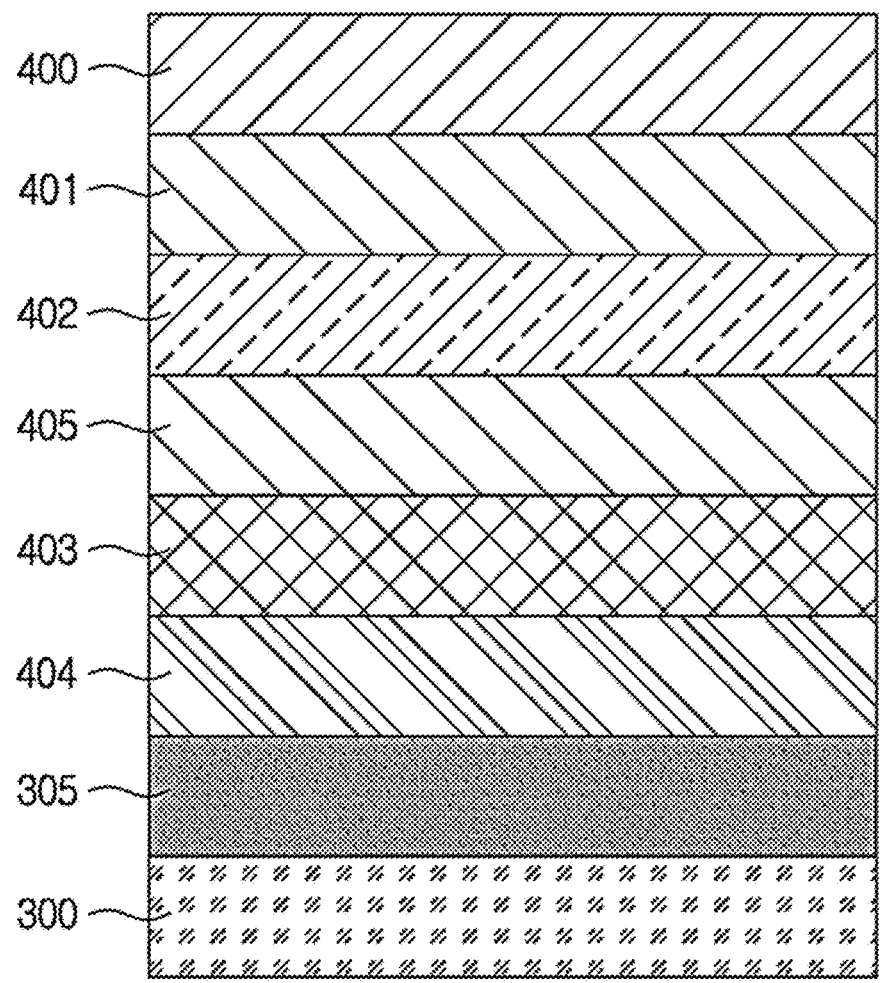
Figure 5C:
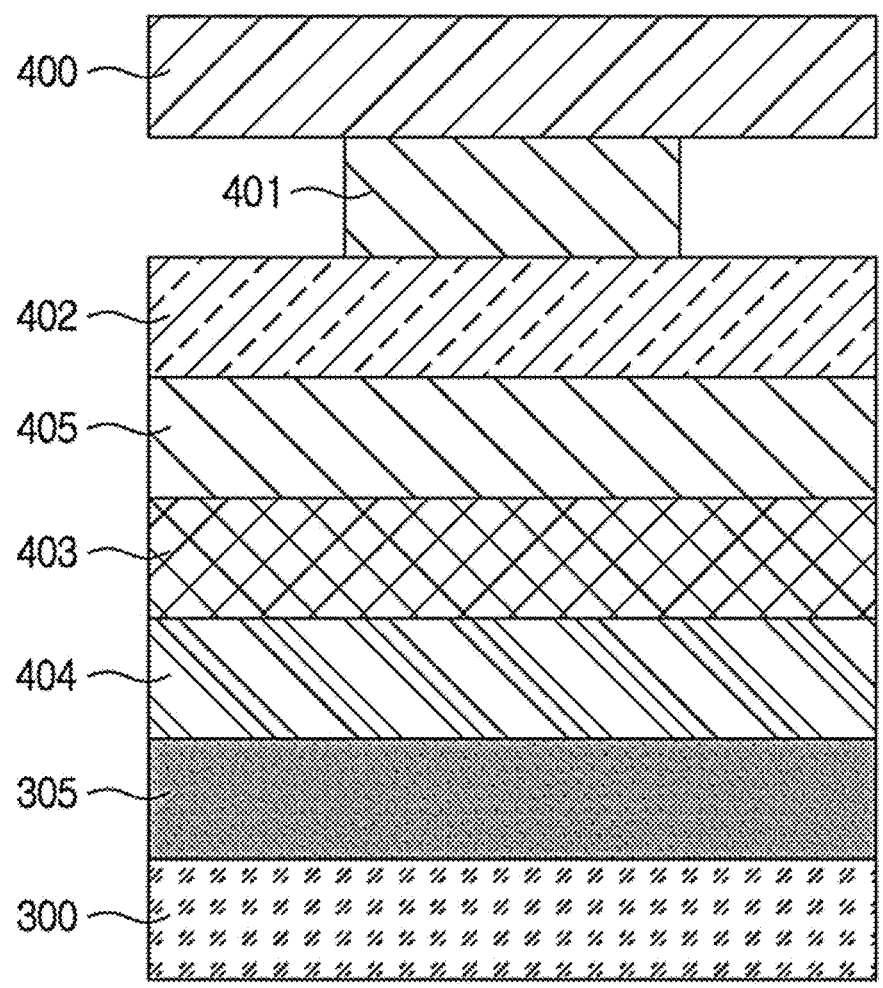

FIGS. 5A to 5C are cross-sectional views illustrating each of the operations of the method for manufacturing a semiconductor device according to another embodiment. In this embodiment, the surface direction of the Group III-V compound substrate is predetermined adequately so that the electron or hole mobility in the Group III-V compound and germanium channels may be improved, and strain may be applied to the Group III-V and germanium channels through a difference in lattice constant.

Referring to FIG. 5A, a sacrificial layer 401, a first semiconductor layer 402, a first barrier layer 405, a second barrier layer 403 and a second semiconductor layer 404 may be formed successively on a first substrate 400 including a Group III-V compound in an epitaxial growth mode. In the case of a Group III-V compound, it shows different electron mobility depending on the surface direction. For example, when the layers 401-405 are formed in an epitaxial growth mode, all of the layers 401-405 formed on the first substrate 400 by using a first substrate 400 whose surface direction is (110) also has a surface direction of (110). In addition, all of the layers 401-405 formed on the first substrate 400 by using a first substrate 400 whose surface direction is (111) also has a surface direction of (111). Therefore, it is possible to maximize the performance of a semiconductor by using a Group III-V compound substrate 400 having an adequate surface direction. For example, the first substrate 400 may be an indium phosphide (InP) substrate having a surface direction of (100), (110) or (111), but is not limited thereto.

Herein, the layers 401-405 formed on the first substrate 400 may include a material capable of applying strain to the first channel layer 402 and/or the second channel layer 404. In the epitaxial growth mode, when a Group III-V compound channel is formed on a material having a different lattice constant, strain is applied to the channel. The strain applied herein is merely elastic strain while generating no defect in the atomic structure, such as dislocation, caused by plastic strain. In addition, the strain is retained even after the wafer bonding and ELO processes. Thus, it is possible to improve electron and hole mobility depending on the particular type of strain. Depending on a difference in lattice constant between the adjacent layers, the type of strain applied to the first channel layer 402 and/or the second channel layer 404, i.e., compressive strain or tensile strain, and the degree thereof are determined by the lattice constant difference.

For example, when an indium phosphide (InP) substrate is used as the first substrate 400, the sacrificial layer may include indium aluminum arsenic (InAlAs), the first channel layer 402 may include indium gallium arsenic (InGaAs), the first barrier layer 405 may include graded indium aluminum arsenic (InAlAs), the second barrier layer 403 may include aluminum gallium arsenic (AlGaAs), and the second channel layer 404 may include germanium (Ge). In this case, the barrier layers 403, 405 function as stressors which apply strain, and thus strain is applied to the second channel layer 404 disposed at the top thereof. Herein, the graded first barrier layer 405 functions to reduce density of dislocation caused by a significantly large difference in lattice constant between the first channel layer 402 and the second channel layer 404, and serves to accomplish insulation.

Meanwhile, although two layers 403, 405 are used as stressors in this embodiment, only one layer may be used in a variant by adjusting the layer thickness.

Herein, it is required that the barrier layers 403, 405 have a large thickness to sufficient apply strain to the second channel layer 404 and the second channel layer 404 has such a small thickness that strain may occur vertically and uniformly. As the difference in lattice constant between the second channel layer 404 and the underlying layers is increased, the extent of strain applied to the second channel layer 404 is increased. Therefore, the second channel layer 404 should have a thickness smaller than the critical thickness at which plastic strain generating a defect, such as dislocation, occurs so as to retain elastic strain. Since the strain applied as mentioned above is retained even after the subsequent ELO process, it is possible to obtain a semiconductor device having strained Group III-V compound channels.

Meanwhile, the materials for each of the layers 401-405 according to some embodiments are not limited to the above-mentioned materials. For example, it is possible to control the difference in lattice constant between the second channel layer 404 and the underlying layers to a predetermined threshold value or less by controlling the composition of the materials forming the layers 401-405, and thus to control the strain applied to the second channel layer 404. The threshold value may be 5%, preferably 2%-3% of the lattice constant of the layer having a larger lattice constant in the adjacent layers. In addition, it is possible to control the lattice constant to a threshold value or less by adjusting the compositional ratio of the materials forming the layers.

For example, when the second channel layer includes germanium (Ge) and the first barrier layer 405 includes indium aluminum arsenic ($In_xAl_{1-x}As$), the degree of strain applied to the second channel layer is determined by the extent of x. For example, when x is 0, indium aluminum arsenic ($In_xAl_{1-x}As$) is aluminum arsenic (AlAs) which has a lattice constant of about 5.6606 Å. Thus, tensile strain corresponding to the ratio of the difference in lattice constant between aluminum arsenic (AlAs) and germanium (Ge), i.e., (5.6605−5.64613)/5.6605≈0.2%, is applied to the second channel layer 404. On the other hand, when x is 0.52, indium aluminum arsenic ($In_{0.52}Al_{0.48}As$) has a lattice constant of about 5.8686 Å. Thus, tensile strain corresponding to the ratio of the difference in lattice constant between indium aluminum arsenic ($In_{0.52}Al_{0.48}As$) and germanium (Ge), i.e., (5.8686−5.64613)/5.8686≈3.8%, is applied to the second channel layer 404.

Next, referring to FIG. 5B and FIG. 5C, wafer bonding of the structure as shown in FIG. 5A onto the second substrate 300 made of silicon (Si) is carried out by using a bonding layer 305 containing an oxide in the same manner as described with reference to FIG. 2B and FIG. 2C, and then the sacrificial layer 401 is etched to remove the sacrificial layer 401 and the first substrate 400. In addition, in the same manner as described with reference to FIG. 2D, it is possible to obtain a semiconductor in which the first channel layer 402 and the second channel layer 404 are arranged horizontally.

Figure 6A:
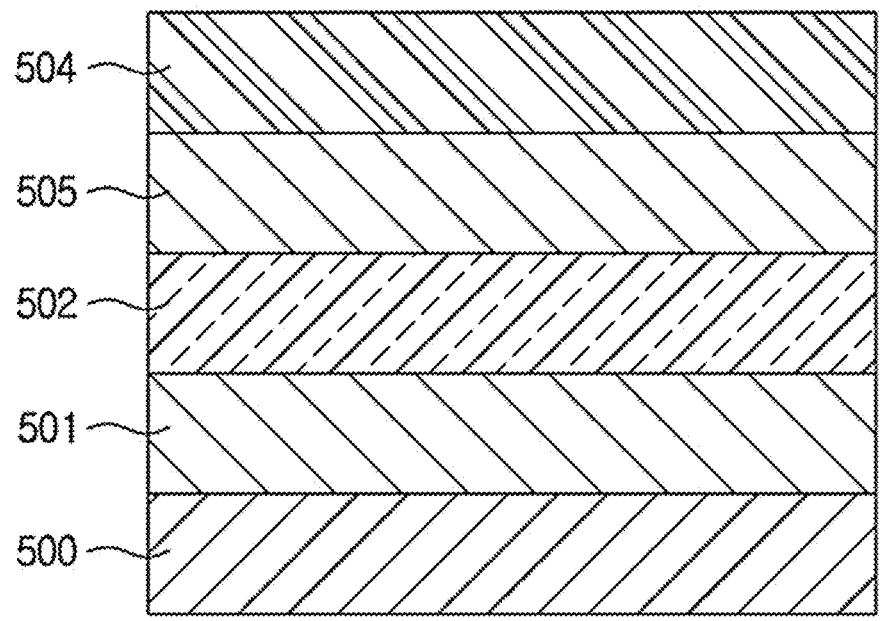
FIGS. 6A and 6B are sectional views illustrating each of the operations of the method for manufacturing a semiconductor device according to still another embodiment.
Figure 6B:
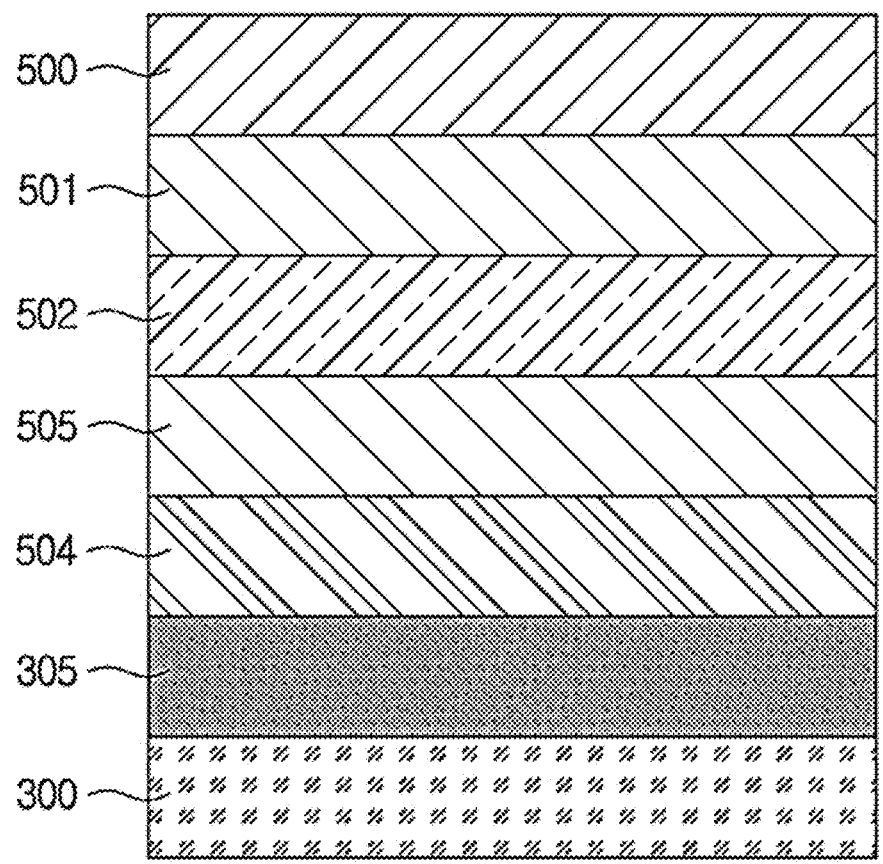

FIG. 6A and FIG. 6B are cross-sectional views illustrating each of the operations of the method for manufacturing a semiconductor device according to still another embodiment. In this embodiment, strain is applied to the Group III-V compound channels through the patterning of the Group III-V compound and the type of strain is controlled to uniaxial or biaxial strain.

Referring to FIG. 6A, a sacrificial layer 501, a first channel layer 502, a first barrier layer 505 and a second channel layer 504 may be formed on a first substrate 500 in an epitaxial growth mode. For example, the first substrate may include indium phosphide (InP), the sacrificial layer 501 may include indium aluminum arsenic (InAlAs), the first channel layer 502 may include indium gallium arsenic (InGaAs), the first barrier layer 505 may include indium aluminum arsenic (InAlAs) and the second channel layer 504 may include germanium (Ge).

In the embodiment described with reference to FIG. 5A-FIG. 5C, the first barrier layer 405 including graded indium aluminum arsenic (InAlAs) is used to apply strain to the second channel layer 404. On the other hand, in this embodiment, strain is applied to the second channel layer 504 by controlling the first barrier layer 505 to have a lattice constant between that of the first channel layer 502 and that of the second channel layer 504. For example, when the first channel layer 502 includes indium gallium arsenic (InGaAs) and the second channel layer 504 includes germanium (Ge), the first barrier layer 505 includes indium aluminum arsenic (InAlAs) (e.g. $In_{0.3}Al_{0.7}As$) having a composition controlled to have a lattice constant between that of indium gallium arsenic (InGaAs) and that of germanium (Ge), thereby applying strain to the second channel layer 504.

However, the above-mentioned materials for the layers are for illustrative purposes only and the materials for the layers 501-505 according to the present disclosure are not limited thereto.

Next, referring to FIG. 6B, wafer bonding of the structure as shown in FIG. 6A onto the second substrate 300 made of silicon (Si) is carried out by using a bonding layer 305 containing an oxide in the same manner as described with reference to FIG. 2B. Then, the sacrificial layer 501 is etched to remove the sacrificial layer 501 and the first substrate 500, and etching is carried out in a partial region to obtain a semiconductor in which the first channel layer 502 and the second channel layer 504 are aligned horizontally.

Figure 6C:
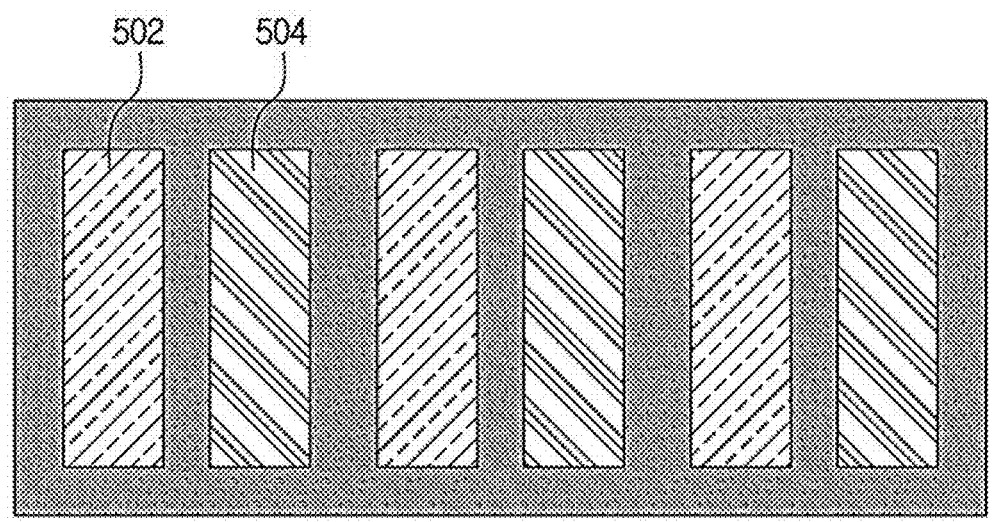
FIGS. 6C and 6D are plan views illustrating the strain characteristics depending on the patterning shape of the channels in the semiconductor device as shown in FIG. 6B.
Figure 6D:
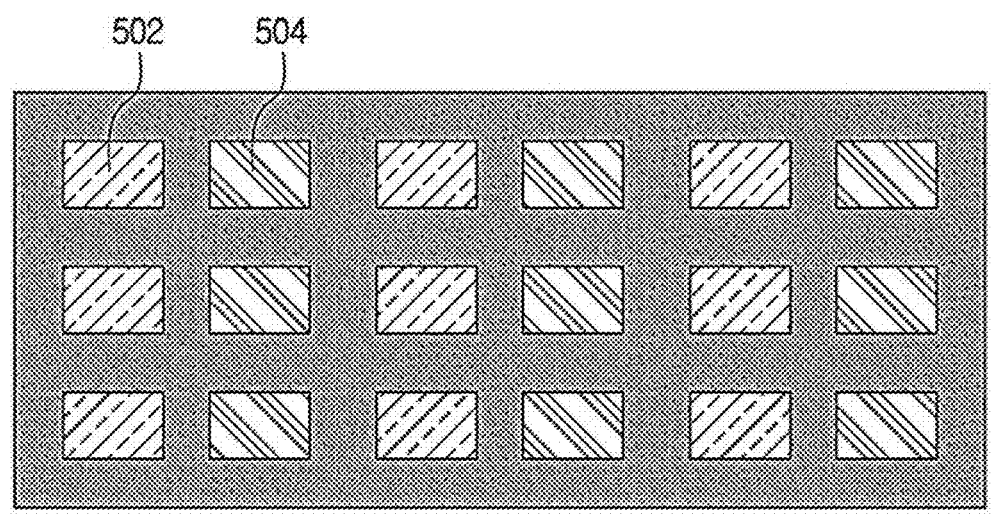

FIG. 6C and FIG. 6D are plan views illustrating the strain characteristics depending on the patterning shape of the channels in the semiconductor device as shown in FIG. 6B.

As shown in FIG. 6C, according to an embodiment, the first channel layer 502 and the second channel layer 504 are patterned into the shape of a plurality of stripes extended in one direction. In this case, uniaxial anisotropic stain is applied to the second channel layer 504 due to a difference in lattice constant between the second channel layer and the underlying layers. Referring to FIG. 6D, according to another embodiment, the first channel layer 502 and the second channel layer 504 are patterned into a shape having a plurality of patterns aligned in the form of a two-dimensional array, such as a shape having quadrangular patterns, aligned and spaced apart from each other on plane xy in each of the directions of x-axis and y-axis. In this case, isotropic strain is applied to the second channel layer 504 due to a difference in lattice constant between the second channel layer and the underlying layers.

Depending on the type of strain, electron and hole mobility is varied in the second channel layer 504. Thus, it is possible to control the strain of the second channel layer 504 through patterning with an adequate shape. Particularly, when applying uniaxial anisotropic strain, electron and hole mobility is varied depending on the longer axis direction of patterning, and thus the patterning direction may be determined adequately by using this. For example, it is possible to increase electron and hole mobility by patterning the second channel layer 504 into the shape of a plurality of stripes extended in [100] or [110] lattice direction. In addition, a different in-plane direction is applied depending on the surface direction (100), (110) or (111) of the second channel layer 504. Both in the case of compressive strain and tensile strain of the second channel layer 504, it is possible to control the characteristics of strain to uniaxial anisotropic or isotropic strain in the same manner.

Figure 7A:
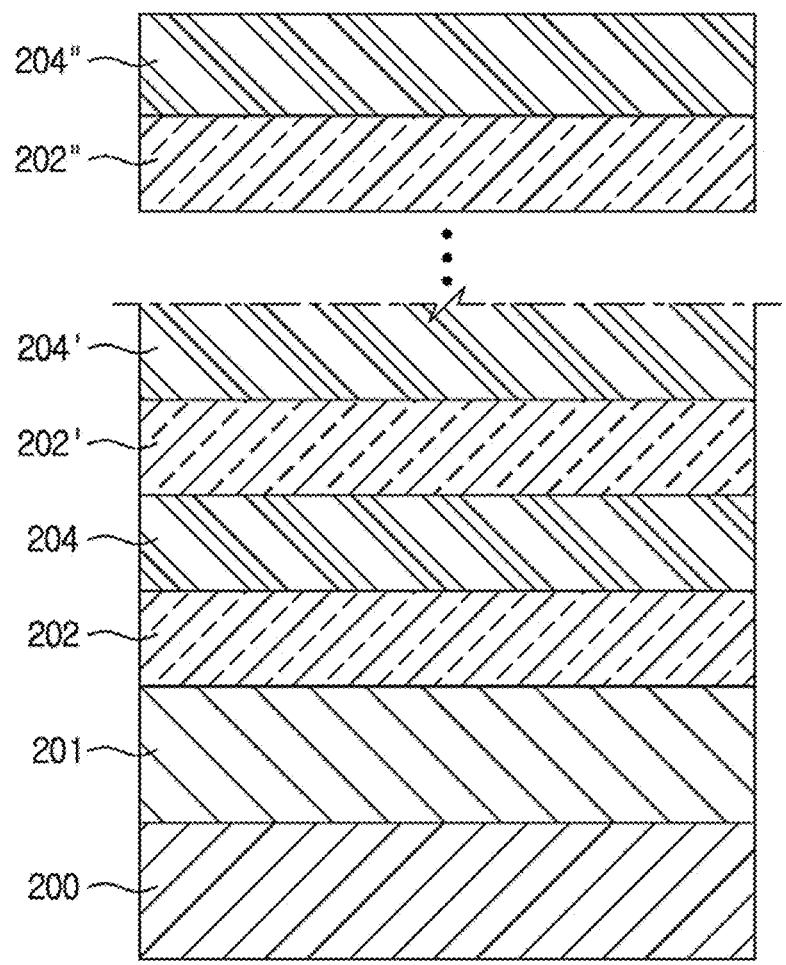
FIGS. 7A to 7D are sectional views illustrating each of the operations of the method for manufacturing a semiconductor device according to yet another embodiment.
Figure 7B:
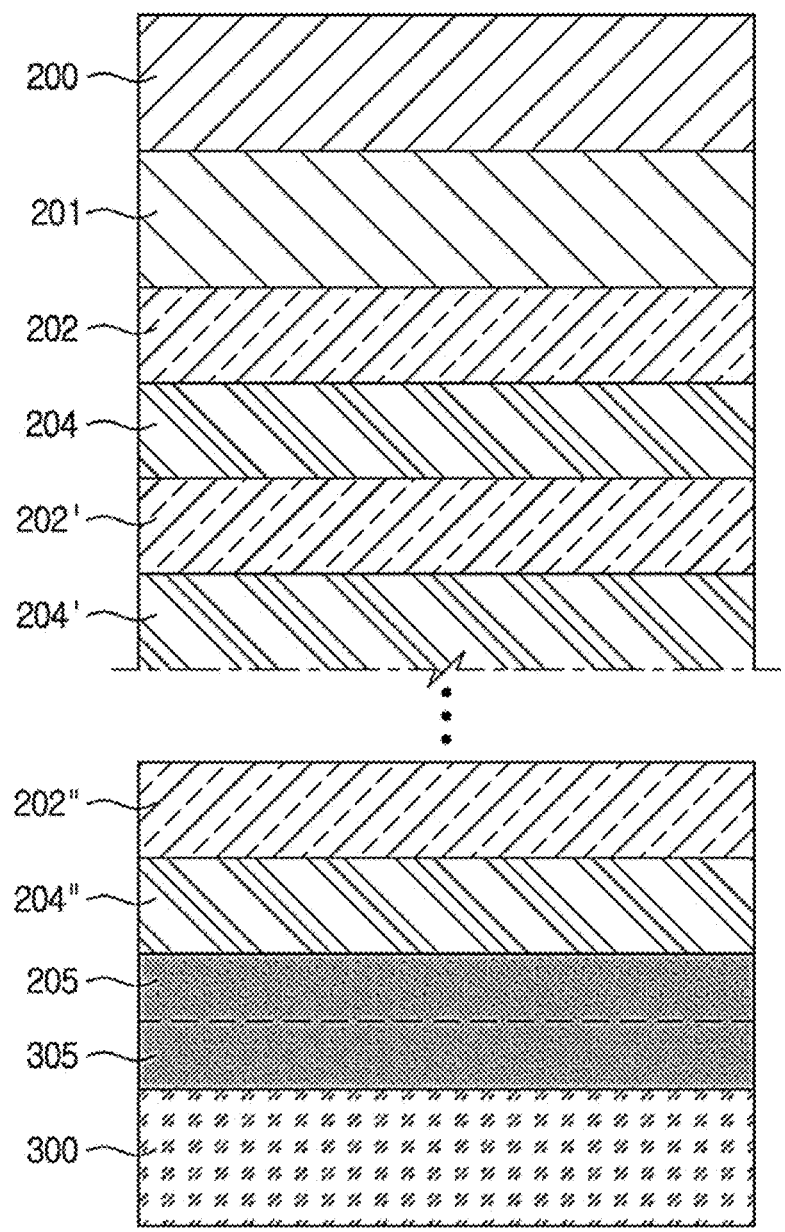
Figure 7C:
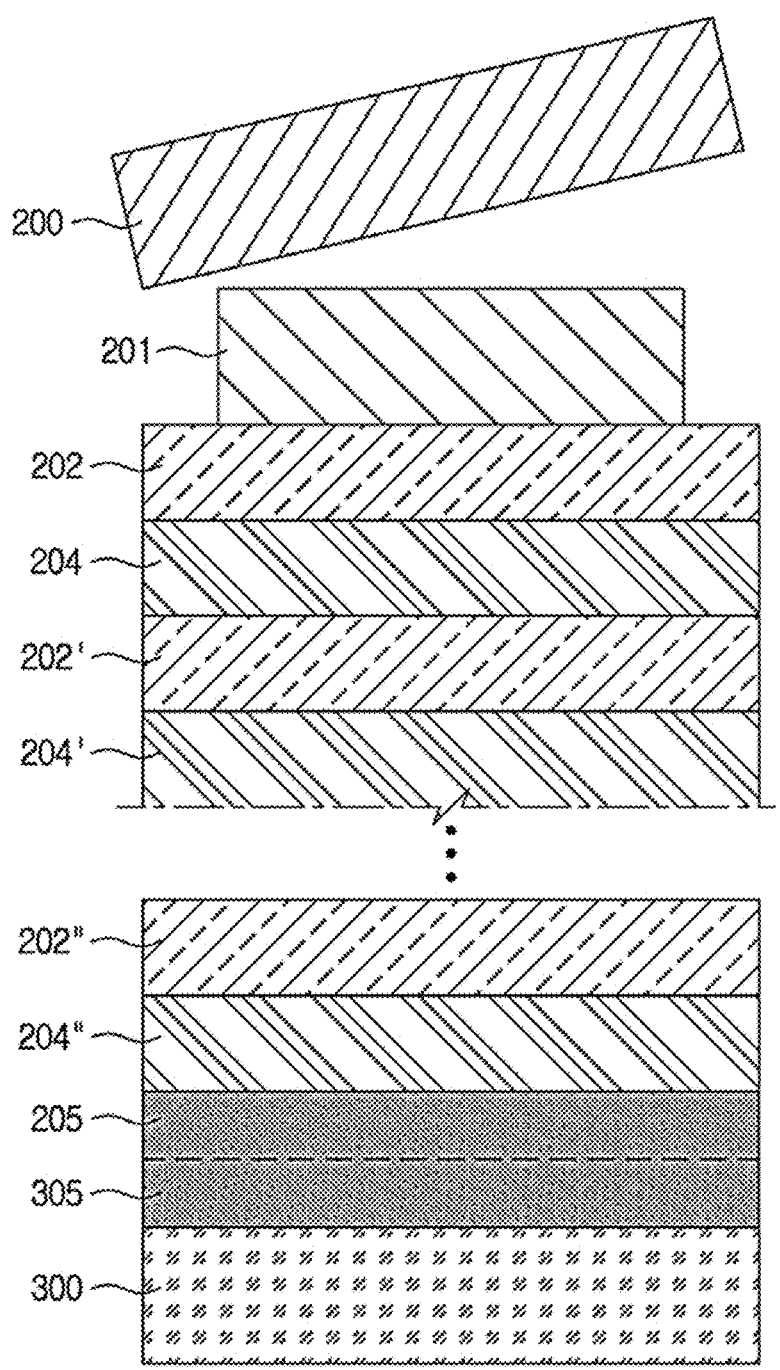
Figure 7D:
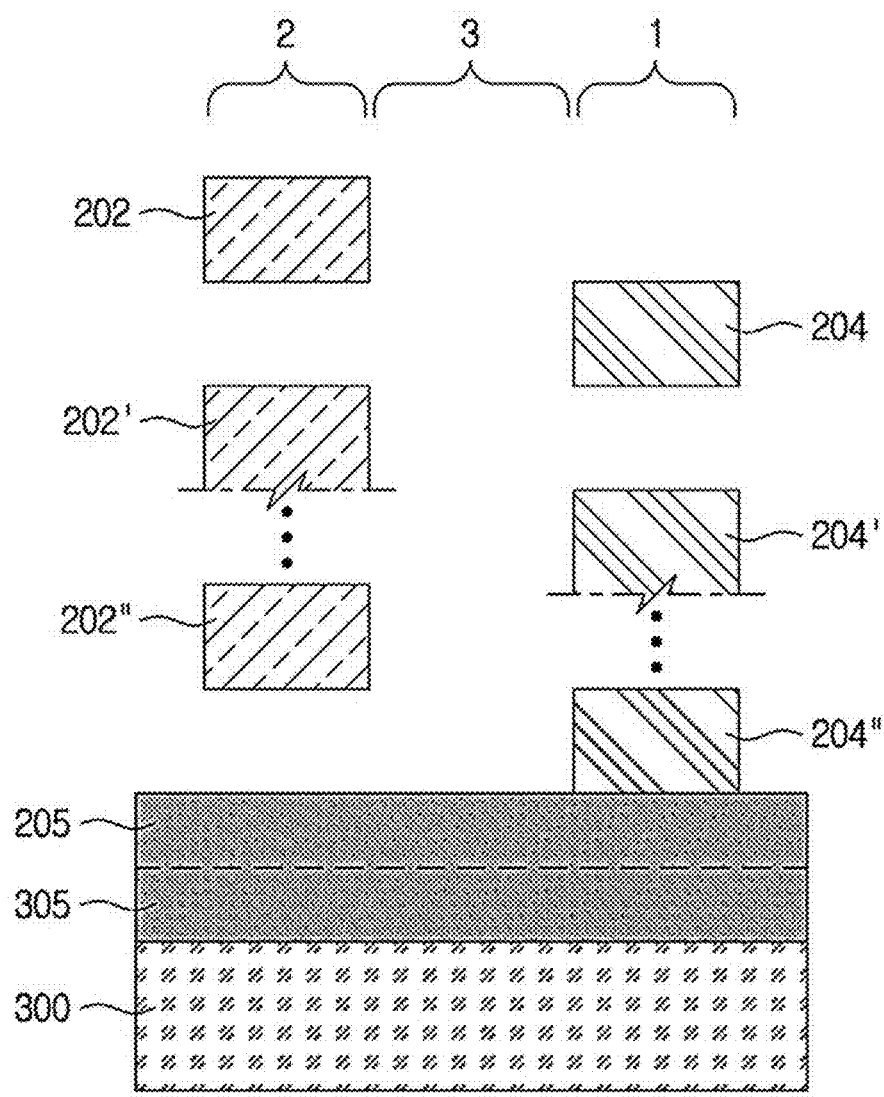
Figure 7E:
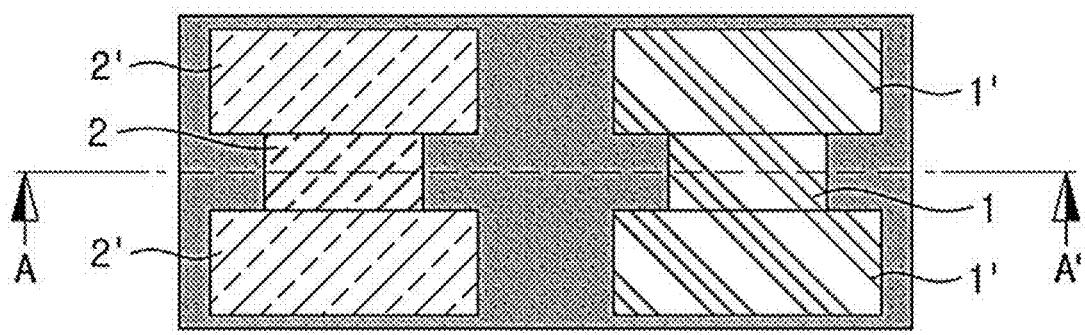
FIG. 7E is a plan view of the semiconductor device as shown in FIG. 7D.

FIGS. 7A to 7D are cross-sectional views illustrating each of the operations of the method for manufacturing a semiconductor device according to yet another embodiment, and FIG. 7E is a plan view of the semiconductor device as shown in FIG. 7D.

Referring to FIG. 7A, in this embodiment, at least one additional first channel layer 202', 202" and at least one additional second channel layer 204', 204" are further formed on the top of the first channel layer 202 and the second channel layer 204 in the structure as described above with reference to FIG. 2A. The additional first channel layers 202', 202" and additional second channel layers 204', 204" are disposed alternately, and thus the structure has a structure in which the first channel layers 202, 202', 202" and the second channel layers 204, 204", 204"' are stacked alternately many times repeatedly. The number of the first channel layers and that of the second channel layers as shown in the drawings are for illustrative purposes only, and the present disclosure is not limited thereto.

The additional first channel layers 202', 202" and the second channel layers 204', 204" may be formed in an epitaxial growth mode like the first channel layer 202 and the second channel layer 204. In addition, the first channel layers 202, 202', 202" and the second channel layers 204, 204', 204" may include materials having no or significantly small difference in lattice constant. For example, the first channel layers 202, 202', 202" may include gallium arsenic (GaAs) and the second channel layers 204, 204', 204" may include germanium (Ge).

Then, referring to FIG. 7B and FIG. 7C, wafer bonding of the structure as shown in FIG. 7A onto the second substrate 300 made of silicon (Si) is carried out by using bonding layers 205, 305 containing an oxide in the same manner as described with reference to FIG. 2B and FIG. 2C. Then, the sacrificial layer 201 is etched through an ELO process to remove the sacrificial layer 201 and the first substrate 200.

Then, referring to FIG. 7D and FIG. 7E, in a partial region 1 of the exposed surface of the structure stacked vertically on the second substrate 300, the first channel layers 202, 202' inserted in the second channel layers 204, 204', 204" and the first channel layer 202" on the topmost surface of the structure are removed. This may be carried out by using an etching solution capable of removing the first channel layers 202, 202', 202" selectively while not affecting the second channel layers 204, 204', 204". In the same manner, in another partial region 2 of the structure, the second channel layers 204, 204' inserted in the first channel layers 202, 202', 202" and the second channel layer 204" between the first channel layer 202 and the substrate 300 are removed by using an etching solution.

Herein, both the first channel layers 202, 202', 202" and the second channel layers 204, 204', 204" may be removed in the region 3 between the region 1 in which the second channel layers 204, 204', 204" remain only and the region 2 in which the first channel layers 202, 202', 202" remain only, so that the region 2 and region 1 may be spaced apart from each other horizontally. As a result, in the region 1, a plurality of second channel layers 204, 204', 204" are formed in the form of nanoplates or nanowires supported in space. Similarly, in the other region 2, nanoplate- or nanowire-shaped channels are formed from a plurality of first channel layers 202, 202', 202".

The sectional view of FIG. 7D is taken along the line of A-A' in FIG. 7E. In both laterally adjacent regions 1', 2' except the regions 1, 2 having the nanoplate- or nanowire-shaped channels, the second channel layers 204', 204" inserted between the first channel layers 202, 202', 202" or the first channel layers 202, 202' inserted between the second channel layers 204, 204', 204" are not removed but only the first channel layer 202" on the topmost surface of the structure is removed in the region 1. As a result, the adjacent regions 1', 2' may function as support structures which support the nanoplate- or nanowire-shaped channels in the regions 1, 2 therebetween.

According to this embodiment, there is an advantage in that current matching is allowed in an apparatus, such as CMOS, through the repetition number of stacking the first channel layers 202, 202', 202" and the second channel layers 204, 204', 204" without any loss of footprint occupied by a semiconductor device.

The present disclosure has been described in detail with reference to the embodiments as shown in the accompanying drawings. However, it should be understood that the detailed description and specific examples are given by way of illustration only, and various changes and modifications within the scope of the disclosure will become apparent to those skilled in the art from this detailed description. Therefore, the scope of the present disclosure is defined by the following claims.

What is claimed is:

1. A method for manufacturing a semiconductor device, which comprises:

forming a first channel layer comprising a Group III-V compound or germanium (Ge) and having a first semiconductor characteristics on a first substrate;

forming a second channel layer comprising a Group III-V compound or germanium (Ge) and having a second semiconductor characteristics different from the first semiconductor characteristics on the first channel layer by an epitaxial growth process;

forming a bonding layer containing an oxide on the second channel layer opposite to the first channel layer;

stacking a structure comprising the bonding layer, the second channel layer, the first channel layer and the first substrate on a second substrate by allowing the bonding layer to be bound to the second substrate, wherein said forming the first channel layer and said forming the second channel layer are carried out repeatedly, so that the structure has a structure in which the first channel and the second channel layer are stacked alternately many times;

removing the first substrate stacked on the second substrate;

removing the first channel layer from a first region of the structure stacked on the second substrate by selective etching, and removing the second channel layer from a second region of the structure stacked on the second substrate by selective etching, wherein the second region is a different region from the first region in a plan view, wherein the selective etching is not performed in a first adjacent region of the structure which is adjacent to the first region and a second adjacent region of the structure which is adjacent to the second region, and the first adjacent region and the second adjacent region support the second channel layer in the first region and the first channel layer in the second region, respectively, so that the second channel layer in the first region and the first channel layer in the second region have a nanoplate or nanowire shape in space, wherein said forming the bonding layer on the second channel layer and said stacking the structure on the second substrate are performed after said forming the second channel layer on the first channel layer.

2. The method for manufacturing a semiconductor device according to claim 1, wherein said forming the first channel layer comprises forming a sacrificial layer on the first substrate, the first channel layer is positioned on the sacrificial layer, and said removing the first substrate comprises removing the sacrificial layer by etching.

3. The method for manufacturing a semiconductor device according to claim 2, wherein the sacrificial layer comprises aluminum arsenic (AlAs) or indium aluminum arsenic (InAlAs).

4. The method for manufacturing a semiconductor device according to claim 1, which further comprises forming a barrier layer on the first channel layer, before said forming the second channel layer.

5. The method for manufacturing a semiconductor device according to claim 4, wherein the barrier layer has a lattice constant different from the lattice constant of at least one of the first channel layer and the second channel layer.

6. The method for manufacturing a semiconductor device according to claim 4, wherein the barrier layer comprises aluminum gallium arsenic (AlGaAs) or indium aluminum arsenic (InAlAs).

7. The method for manufacturing a semiconductor device according to claim 1, which further comprises forming an additional bonding layer on the second substrate, before said stacking onto the second substrate.

8. The method for manufacturing a semiconductor device according to claim 1, which further comprises removing the first channel layer and the second channel layer from a third region disposed between the first region and the second region in the plan view so that the first region and the second region are spaced apart from each other, wherein the third region is a different region from the first adjacent region and the second adjacent region.

9. The method for manufacturing a semiconductor device according to claim 1, wherein the first channel layer comprises gallium arsenic (GaAs) or indium gallium arsenic (InGaAs), and the second channel layer comprises germanium (Ge) or gallium arsenic (GaAs).

* * * * *